United States Patent
Bjoerk et al.

(10) Patent No.: US 8,772,877 B2
(45) Date of Patent: Jul. 8, 2014

(54) TUNNEL FIELD-EFFECT TRANSISTOR

(75) Inventors: Mikael T Bjoerk, Affoltern am Albis (CH); Andreas Christian Doering, Zufikon (CH); Phillip Stanley-Marbell, Adliswil (CH); Kirsten Emilie Moselund, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 51 days.

(21) Appl. No.: 13/551,785

(22) Filed: Jul. 18, 2012

(65) Prior Publication Data
US 2013/0021061 A1    Jan. 24, 2013

(30) Foreign Application Priority Data
Jul. 22, 2011  (EP) .................................. 11175123

(51) Int. Cl.
*H01L 29/78*  (2006.01)

(52) U.S. Cl.
USPC .......................................... 257/365; 438/197

(58) Field of Classification Search
USPC ........................................................ 257/365
See application file for complete search history.

(56) References Cited

U.S. PATENT DOCUMENTS

| | | | |
|---|---|---|---|
| 7,812,370 B2 | 10/2010 | Bhuwalka et al. | |
| 8,309,988 B2 * | 11/2012 | Niiyama et al. | 257/192 |
| 2005/0051855 A1 * | 3/2005 | Kanegae et al. | 257/410 |
| 2008/0312088 A1 | 12/2008 | Chung et al. | |
| 2009/0101975 A1 | 4/2009 | Holz et al. | |
| 2010/0140589 A1 | 6/2010 | Ionescu | |
| 2010/0200916 A1 | 8/2010 | Gossner et al. | |
| 2011/0049586 A1 * | 3/2011 | De Zaldivar et al. | 257/288 |

FOREIGN PATENT DOCUMENTS

| | | |
|---|---|---|
| EP | 1901354 A1 | 3/2008 |
| WO | WO 2010/10944 A1 | 1/2010 |

OTHER PUBLICATIONS

Xuebei Yang et al., Ambipolar Electronics, Department of Electrical and Computer Engineering, Mar. 2, 2010, pp. 1-5, Rice University, Houston.

* cited by examiner

*Primary Examiner* — Thao P Le
(74) *Attorney, Agent, or Firm* — Vazken Alexanian

(57) ABSTRACT

A tunnel field-effect transistor including at least: a source region including a corresponding source semiconductor material; a drain region including a corresponding drain semiconductor material, and a channel region including a corresponding channel semiconductor material, which is arranged between the source region and the drain region. The tunnel field-effect transistor further includes at least: a source-channel gate electrode provided on an interface between the source region and the channel region; an insulator corresponding to the source-channel gate electrode that is provided between the source-channel gate electrode and the interface between the source region and the channel region; a drain-channel gate electrode provided on an interface between the drain region and the channel region; and an insulator corresponding to the drain-channel gate electrode that is provided between the drain-channel gate electrode and the interface between the drain region and the channel region.

23 Claims, 4 Drawing Sheets

A

B

C

D

TUNNEL FIELD-EFFECT TRANSISTOR

CROSS REFERENCE TO RELATED APPLICATION

This application claims priority under 35 U.S.C. 119 from European Application 11175123.6, filed Jul. 22, 2011, the entire contents of which are incorporated herein by reference.

BACKGROUND OF THE INVENTION

1. Field of the Invention

The present invention relates to a tunnel field-effect transistor (TFET) and a method of fabrication therefor.

2. Background of the Invention

Complementary metal-oxide semiconductor (CMOS) technology is used in high-speed switching and logic applications. A drawback associated with CMOS-based devices in, for example, logic applications is that device-scaling in the sub-65 nm regime is limited, not by the intrinsic switching speeds of such devices, but rather by the magnitude of the power that they dissipate. The semiconductor industry has been engaged in seeking a successor to CMOS that has relatively lower power dissipation compared to CMOS and that may be used in logic applications. For devices in which a logic state is represented by charge, it is known that a reduction in power dissipation may be attained by a reduction in an operating voltage and/or a reduction in a loading capacitance. In this regard, the tunnel field effect transistor (TFET) may be operated at relatively lower operating voltages due to its potential for the sub-kT/Q sub-threshold slope. This has the corresponding result that TFETs have a reduced power dissipation compared to previously-proposed devices such as, for example, CMOS field-effect transistors (FETs), thus making TFETs a promising successor to traditional CMOS. Some examples of single-gated TFETs may be found at U.S. Pat. No. 7,812,370B2 and US2010/0200916A1.

TFETs have some properties which are in contrast to, for example, CMOS-based devices such as metal-oxide semiconductor field-effect transistors (MOSFETs), and which may serve to limit their use in logic applications. For instance, it is known that TFETs are inherently ambipolar in terms of gate bias, that is, current is conducted for the application of a positive or a negative gate bias. This may be undesirable, particularly in logic applications, where it is preferable that the "ON" and "OFF" states of a device are distinct. In this regard, steps may be taken to make the TFET increasingly unipolar, that is, impeding current conduction for one of the gate polarities, such steps including, for example, the use of doping differentiation, heterostructures, or a gate underlap. Furthermore, the asymmetric "p-i-n" structural implementation of the TFET is in contrast to that of the MOSFET, which is implemented in one of the "n-p-n" or "p-n-p" modes. This structural asymmetry of the TFET may pose some problems for its implementation in certain types of logic applications, such as, for example, pass-gate logic used in SRAM (static random access memory).

US2009/0101975A1 discloses an integrated circuit including: a first connection region disposed in a semiconductor body, the first connection region being of a first doping type, an adjacent region disposed in the semiconductor body adjoining the first connection region, the adjacent region being either doped or undoped in accordance with a second doping type, the second doping type being different from the first doping type, an electrically insulating first insulation region disposed at a boundary between the first connection region and adjacent region, and a first control region adjoining the insulation region. This document discloses an integrated semiconductor circuit including: a TFET with an associated gate formed substantially over the channel region of the TFET and a planar FET with a gate associated thereto, with the TFET and the planar FET being laterally disposed relative to each other. The gate dielectric associated with the TFET is chosen to be thicker than the gate dielectric associated with the planar FET, this feature offering the advantage that the gate leakage current and, therefore, the power consumption of the TFET disclosed in US2009/0101975A1 are lower than in previously-proposed devices such as TFETs and/or FETs without this feature.

US2010/0140589A1 discloses a ferroelectric TFET including a ferroelectric gate stack and band-to-band tunnelling in a gated p-i-n junction, wherein the ferroelectric material included in the gate stack creates, due to dipole polarisation with increasing gate voltage, a positive feedback in the capacitive coupling that controls band-to-band (BTB) tunnelling at the source junction of a silicon p-i-n reversed bias structure, such that the combined effect of the BTB tunnelling and ferroelectric negative capacitance apparently offers more abrupt off-on and on-off transitions compared to previously-proposed TFETs or ferroelectric FETs. This document discloses a ferroelectric TFET including a source-channel-drain structure with two gates being formed on either side of the channel in a perpendicular direction relative to the plane in which the source-channel-drain are disposed.

Turning to WO2010/010944A1, this document discloses a complementary logical gate device represented by a silicon CMOS logical circuit among semiconductor integrated logical circuits, which is concerned with solving the problem of the speed performance limit of an ultra-large scale integration and an ultra low-power consumption type logical circuit. The complementary logical gate disclosed in this document includes an electron running layer formed from graphene without using an n-channel or a p-channel FET, has the ambipolar characteristic and uses only two FETs having different threshold values, i.e. a first FET and a second FET.

US2008/0312088A1 discloses a field-effect transistor including: an ambipolar layer including a source region, a drain region and a channel region between the source region and the drain region, wherein the source region, the drain region and the channel region are formed in a monolithic structure, a gate electrode on the channel region, and an insulating layer separating the gate electrode from the ambipolar layer, wherein the source region and the drain region have a width greater than that of the channel region in a second direction that crosses a first direction in which the source region and the drain region are connected to each other. In a multi-gated configuration of the device disclosed in US2008/0312088A1, the gate electrode includes a first gate electrode and a second gate electrode that are respectively formed close to the source region and the drain region above the channel region, wherein when a voltage is selectively applied to the first gate electrode or the second gate electrode, the FET is of an n-type or of a p-type. In the device disclosed in this document, the band-gap of the ambipolar layer may be tailored by way of the choice of width of the channel region relative to that of the source region and the drain region in a specific direction.

In EP1901354A1, there is disclosed a TFET including: a source-channel-drain structure including at least one doped source region, at least one doped drain region, and at least one channel region which is situated in between the at least one source region and the at least one drain region, and forming a source-channel interface with the source region and a drain-channel interface with the drain region, a gate electrode which is covering at least part of the at least one source region, at least extending up to the source-channel interface such that there is a finite distance between the end of the gate electrode and the plane of the channel-drain interface, such that there is no coverage by the gate electrode of the drain region. This document also discloses a multi-gated TFET with one gate overlapping the source and the channel, and another gate being formed on the channel close to the drain but with no overlap with the drain. This gates' structure is replicated on the opposite surface of the channel, in a plane perpendicular to that in which the source-channel-drain structure is arranged, such that there are four gates in total. It is disclosed that the device of EP1901354A1 has improved switching speeds whilst gaining a processing advantage due to there being no need for gate-drain alignment. Furthermore, it is stated that the disclosed device has an improved performance on account of the ambipolar behavior thereof being reduced.

Reference is now made to Yang et. al, Rice University Technical Report TREE1002, pages 1-4, which provides a report on ambipolar electronics, and, particularly, discusses the applications of ambipolar devices such as Graphene and CNT (carbon nanotube) devices.

The development of previously-proposed TFETs has been done in order to: improve device performance by, for example, suppressing some of the inherent characteristics of TFETs that are different from those associated with CMOS-based devices, such as, the ambipolar nature of TFETs; improve device switching speeds; and further reduce power dissipation/consumption. Development of TFETs so that they may potentially be applied in diverse logic applications by, for example, harnessing those properties that set it apart from CMOS-based devices has as yet to be addressed.

SUMMARY OF THE INVENTION

In order to overcome these deficiencies, the present invention provides a tunnel field-effect transistor, including: at least a source region including a corresponding source semiconductor material; at least a drain region including a corresponding drain semiconductor material, and at least a channel region including a corresponding channel semiconductor material, which is arranged between the source region and the drain region, the tunnel field-effect transistor further including: at least a source-channel gate electrode provided on at least an interface between the source region and the channel region; at least an insulator corresponding to the source-channel gate electrode that is provided between the source-channel gate electrode and at least the interface between the source region and the channel region, at least a drain-channel gate electrode provided on at least an interface between the drain region and the channel region, and at least an insulator corresponding to the drain-channel gate electrode that is provided between the drain-channel gate electrode and at least the interface between the drain region and the channel region.

According to another aspect, the present invention provides a method for fabricating a tunnel field-effect transistor, including: providing at least a source region including a corresponding source semiconductor material; providing at least a drain region including a corresponding drain semiconductor material, and providing at least a channel region including a corresponding channel semiconductor material, which is arranged between the source region and the drain region, the method further including: providing at least a source-channel gate electrode on at least an interface between the source region and the channel region; providing at least an insulator corresponding to the source-channel gate electrode between the source-channel gate electrode and at least the interface between the source region and the channel region; providing at least a drain-channel gate electrode on at least an interface between the drain region and the channel region; and providing at least an insulator corresponding to the drain-channel gate electrode between the drain-channel gate electrode and at least the interface between the drain region and the channel region.

According to yet another aspect, the present invention provides a use of a tunnel field-effect transistor to implement an XNOR logic gate, the tunnel field-effect transistor including: at least a source region including a corresponding source semiconductor material; at least a drain region including a corresponding drain semiconductor material; and at least a channel region including a corresponding channel semiconductor material, which is arranged between the source region and the drain region, the tunnel field-effect transistor further including: at least a source-channel gate electrode provided on at least an interface between the source region and the channel region; at least an insulator corresponding to the source-channel gate electrode that is provided between the source-channel gate electrode and at least the interface between the source region and the channel region; at least a drain-channel gate electrode provided on at least an interface between the drain region and the channel region; and at least an insulator corresponding to the drain-channel gate electrode that is provided between the drain-channel gate electrode and at least the interface between the drain region and the channel region.

DETAILED DESCRIPTION OF THE PREFERRED EMBODIMENTS

Figure 1:
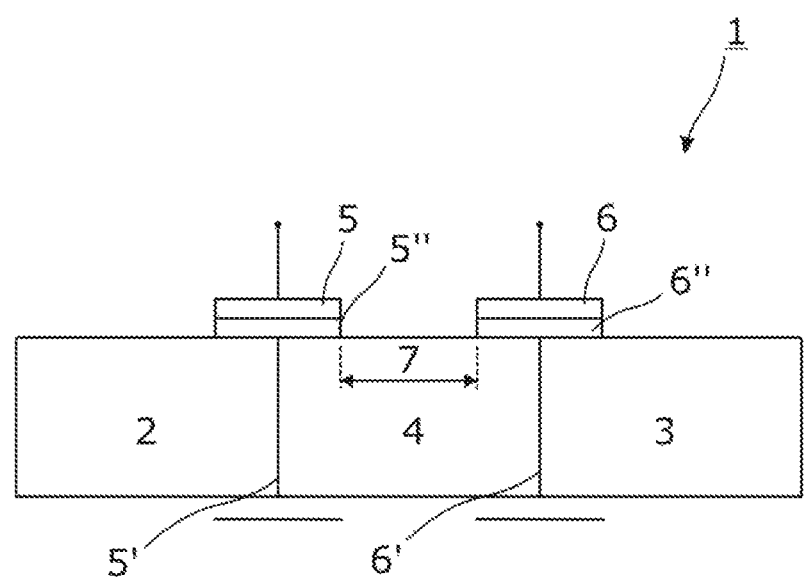
FIG. 1 schematically illustrates an embodiment of the present invention.

Within the description, the same reference numerals or signs have been used to denote the same parts or the like.

Reference is now made to FIG. 1, which schematically illustrates an embodiment according to a device aspect of the present invention.

As can be seen from FIG. 1, an embodiment of the present invention includes a TFET 1 that includes: a source region 2 including a corresponding source semiconductor material; a drain region 3 including a corresponding drain semiconductor material, and a channel region 4 including a corresponding channel semiconductor material, which is provided between the source region 2 and the drain region 3. The source semiconductor material and the drain semiconductor material are doped with carriers such that the polarity of the carriers of the source semiconductor material is different from that of the carriers with which the drain semiconductor material is doped. So, if the source semiconductor material is n-type doped, then the drain semiconductor material is p-type doped and vice versa. The channel semiconductor material is configured so as to have an intrinsic (i) carrier concentration or to have a relatively low doping, such as, for example, 1e15 cm$^3$ carriers. In this way, an embodiment of the present invention has three distinct regions, which respectively include a p-type doped region, a region with intrinsic carrier concentration or relatively low doping, and an n-type doped region. Collectively, the three distinct regions include a p-i-n structure 1 by which TFETs are characterised. In an embodiment of the present invention, there are provided at least two gate electrodes on the previously described p-i-n structure 1: at least a source-channel gate electrode 5 provided on at least an interface between the source region 2 and the channel region 4, and a drain-channel gate electrode 6 provided on at least an interface between the drain region 3 and the channel region 4. The source-channel gate electrode 5 and the drain-channel gate electrode 6 may be independently controlled in terms of bias application. Respective insulators 5", 6" corresponding to the source-channel gate electrode 5 and the drain-channel gate electrode 6 are also provided. The insulators 5", 6" may be provided in a stacked structure, that is, between a corresponding gate electrode 5, 6 and the region above the p-i-n structure 1 in an embodiment of the present invention where the gate electrode 5, 6 is formed. Each of the insulators 5", 6" may include: a dielectric material such as, for example, $SiO_2$, $Al_2O_3$, $HfO_2$; certain combinations of dielectric materials, such as, for example, $SiO_2/HfO_2$, or alloys of dielectric materials, such as, for example, $Si_xH_yfO_z$. An embodiment of the present invention is not limited to the aforementioned examples and, indeed, any other suitable dielectric materials that offer the advantage of a reduced leakage current from the dual-gate electrodes 5, 6 to the channel region 4 may be used in an embodiment of the present invention. The insulators 5", 6" in an embodiment of the present invention can include the same or different dielectric materials.

By way of the source-channel gate electrode 5 and the drain-channel gate electrode 6, and, more specifically the bias applied thereto, a respective tunnelling current that flows between the tunnelling junction at the source-channel interface 5' and the drain-channel interface 6' may be controlled. Thus, for a specific input, that is, the individual biases applied to the gate electrodes 5, 6, a desired output can be facilitated. The desired output can correspond to one of the two following scenarios: flow of the tunnelling current between either the tunnelling junction formed at the source-channel interface 5' or the tunnelling junction formed at the drain-channel interface 6', or the tunnelling current being substantially blocked and/or suppressed from flowing between the aforementioned tunnelling junctions.

An embodiment of the present invention can be used to implement an XNOR logic function. By appropriately choosing the bias applied to the gate electrodes 5, 6 of an embodiment of the present invention, one of the tunnelling junctions may be opened, that is, the flow of tunnelling current through a desired tunnelling junction, either that formed at the source-channel interface 5' or the drain-channel interface 6', can be enabled. This particular scenario may be taken to correspond to when the inputs 00 or 11 yield an output of 1 in XNOR logic. Alternatively, the flow of tunnelling current through both of the tunnelling junctions may be blocked and/or suppressed by an appropriate choice of bias applied to the gate electrodes 5, 6 which scenario may be taken to correspond to when the inputs 10 or 01 yield an output of 0 in XNOR logic.

A distance 7 between the source-channel gate electrode 5 and the drain-channel gate electrode 6 is chosen such that the tunnel field-effect transistor 1 is distinctly operable in one of an on mode and an off mode. This may be facilitated by an appropriate choice of a distance 7 between the source-channel gate electrode 5 and the drain-channel gate electrode 6 such that the flow of tunnelling current is not inhibited in an on mode of operation and it is suppressed and/or not initiated in the off mode of operation. In the context of XNOR logic functionality, for example, the distance 7 between the gate electrodes 5, 6 of an embodiment of the present invention may be chosen to be small enough that the fringing fields corresponding to the gate electrodes 5, 6 influence the region therebetween to the extent that a potential barrier is not created that may limit the tunnelling current corresponding to the 00 or 11 inputs. On the other hand, and for the input configuration of 10 or 01, the distance 7 between the gate electrodes 5, 6 is chosen to be large enough that the fringing fields associated thereto suppress or at least do not increase the tunnelling probability to the extent that a 1 or 0 output is undistinguishable. To facilitate distinct modes of operation, the distance 7 between the source-channel gate electrode 5 and the drain-channel gate electrode 6 is chosen to be in the range of 10-100 nm in an embodiment of the present invention.

In the particular implementation of an embodiment of the present invention as shown in FIG. 1, a nanowire geometry is used with the source-channel gate electrode 5 and the drain-channel gate electrode 6 being formed around the circumference of the nanowire in a wrap-around geometry. An advantage associated with this implementation is that the electrostatic control of the gate electrodes 5, 6 can be tailored. However, an embodiment of the present invention is not limited thereto and implementation by other suitable shapes/geometries is possible. For example, a vertically-standing two dimensional layer, such as is the case for FINFETs, may be used where the dual-gate feature 5, 6 can be added on two sides of the vertical layer, for example, on the vertical sidewalls, or on three sides of the vertical layer, for example, on the vertical sidewalls and the top surface. A further embodiment of the present invention pertains to its implementation with a tubular geometry, that is, a cylindrical or u-shaped structure, for example, CNTs may be used. Of course, an embodiment of the present invention may also be formed with a planar film on which the dual-gate feature 5, 6 is formed.

In an embodiment of the present invention, further features are provided, thereby to facilitate that the tunnelling current corresponding to the source-channel interface 5' can be controlled independently of the tunnelling current corresponding to the drain-channel interface 6'. In this regard, the source semiconductor material can be chosen to be different from at least the drain semiconductor material. Heterostructures, or different combinations of different semiconductor materials, can be used for the source semiconductor material and the drain semiconductor material. This feature can provide the advantage that, the tunnelling probability and, therefore, the tunnelling current is further increased compared to the scenario where the same material is used for the source, channel and drain semiconductor materials. Alternatively, an embodiment of the present invention can also be extended to using heterostructures for the source semiconductor material and the channel semiconductor material. In this regard, examples of source semiconductor material-drain/channel semiconductor material combinations that may be used in an embodiment of the present invention include: Si—Ge, Si—InAs, GaSb—InAs, InP—InAs or combinations thereof. In another embodiment of the present invention, heterostructures may also be used for the drain semiconductor material and the channel semiconductor material.

In an alternative embodiment of the present invention, the source semiconductor material, the channel semiconductor material and the drain semiconductor material can be chosen to be the same. Apart from Si, some examples of other semiconductor materials that can be used for the source, channel and drain region include: Ge, InAs, GaAs, InGaAs and InSb. An advantage associated with the use of these other semiconductor materials over Si is that they have a lower effective mass and so enable larger tunnelling currents. Of course, an embodiment of the present invention is not limited to the use of such other semiconductor materials and, indeed, any other suitable semiconductor material having a lower effective mass than Si may alternatively be used.

In an embodiment of the present invention, the source semiconductor material, the channel semiconductor material and the drain semiconductor material may also be chosen to be different from each other. For example, for the p-i-n structure 1 in an embodiment of the present invention, the following may be used: p(Ge)-i(Si)-n(InAs). Thus, the respective tunnelling currents flowing at the source-channel interface 5' and the drain-channel interface 6' may be independently manipulated through the choice of semiconductor materials of the source region 2, channel region 4 and the drain region 3.

In an embodiment of the present invention, a doping profile of the source semiconductor material and the drain semiconductor material are chosen to facilitate manipulation of a respective electrical field established at the source-channel interface 5' and the drain-channel interface 6'. In this way, the tunnelling current in an embodiment of the present invention can be further enhanced and/or suppressed so that the on and off modes of an embodiment of the present invention can be further differentiated.

Although not shown in FIG. 1, an embodiment of the present invention can include the further feature of a strain applicator that is configurable to apply a strain to the source-channel interface 5' and/or the drain-channel interface 6'. Regarding the energy-band characteristics associated with an embodiment of the present invention, it may be understood that the strain applicator feature can facilitate an Ec discontinuity in the n-i branch and/or an Ev discontinuity can be achieved in the p-i branch. In this way, the tunnelling currents flowing between these respective branches can be manipulated and/or controlled independently of each other. The strain applicator can be provided as a different feature/electrode or it may be integrated in, and form a part of, either of the two gate electrodes 5, 6 in an embodiment of the present invention.

Figure 2:
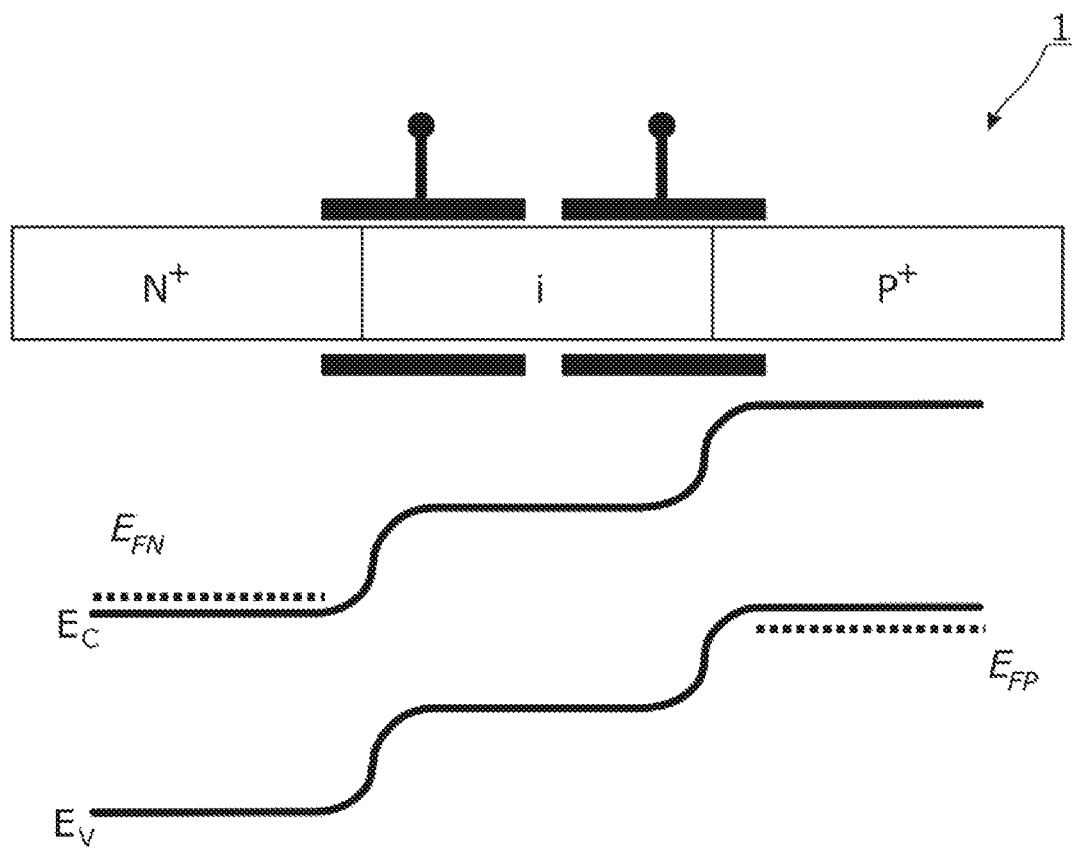
FIG. 2 schematically illustrates an embodiment of the present invention and the energy-band characteristics corresponding thereto.

FIG. 2 schematically illustrates a p-i-n structure 1 according to an embodiment of the present invention and the energy-band diagram associated thereto. In this case, the scenario where no bias is applied to either the source-channel gate electrode 5 or the drain-channel gate electrode 6 is shown. For the n-region of the p-i-n structure 1, the Fermi-level, $E_{FN}$ is disposed above the conduction band edge $E_C$ and, conversely, for the p-region of the p-i-n structure 1, the Fermi-level $E_{FP}$ is disposed below the valence band edge $E_V$.

Figure 3:
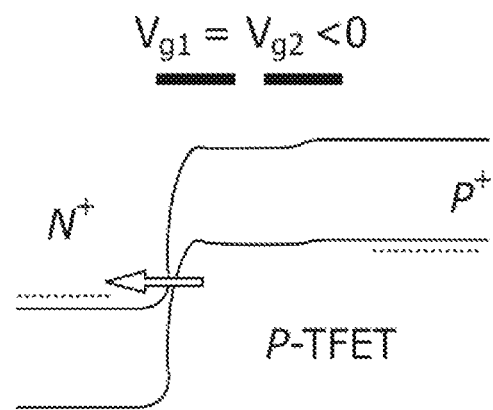
FIG. 3 schematically illustrates a scenario where the same negative-bias value is applied to the gate electrodes in an embodiment of the present invention.

FIG. 3 schematically illustrates a scenario where a p-type TFET is enabled in an embodiment of the present invention, this being done by the application of the same negative-bias value to the gate electrodes 5, 6. An alteration of the energy-band characteristics occurs such that the band-bending of the energy-bands corresponding with the p-branch of the p-i-n structure 1 increases the probability of carriers tunnelling from filled states in the p-branch to empty states in the n-branch, via the tunnelling junction at the n-i interface.

Figure 4:
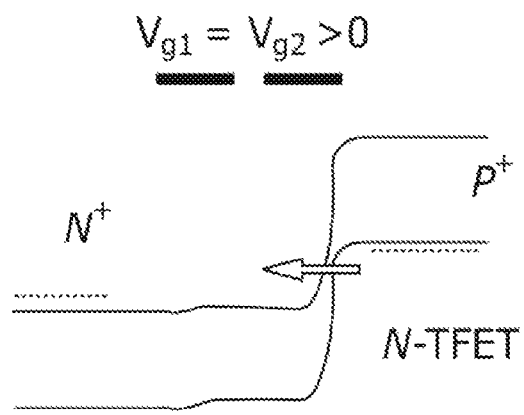
FIG. 4 schematically illustrates a scenario where the same positive-bias value is applied to the gate electrodes in an embodiment of the present invention.

FIG. 4 schematically illustrates a scenario where an n-type TFET is enabled in an embodiment of the present invention, this being done by the application of the same positive-bias value to the gate electrodes 5, 6. Now, an alteration of the energy-band characteristics occurs such that the band-bending of the energy-bands corresponding with the n-branch of the p-i-n structure 1 increases the probability of tunnelling of carriers via the tunnelling junction at the n-i interface, rather than in the opposite direction.

Figure 5:
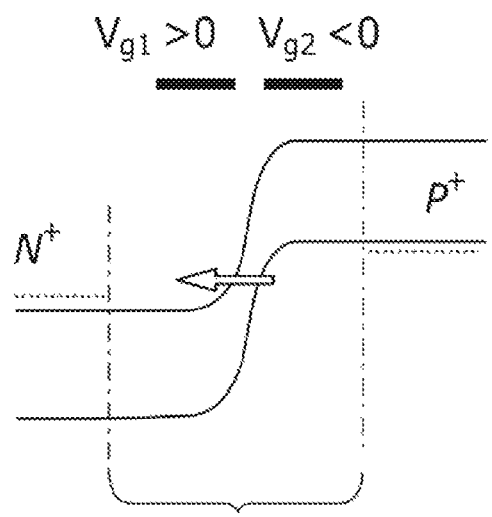
FIG. 5 schematically illustrates a scenario where different biases are applied to the gate electrodes in an embodiment of the present invention, FIG. 6 schematically illustrates yet another scenario where different biases are applied to the gate electrodes in an embodiment.

Reference is now made to FIG. 5, which schematically illustrates a scenario where different biases are applied to the gate electrodes 5, 6 in an embodiment of the present invention. In this case, a p-n junction is created within the p-i-n structure 1 of an embodiment of the present invention by electrostatic doping, which is done by the application of a positive bias to the gate electrode 5, 6 corresponding to the n-i branch and a negative bias to the gate electrode 5, 6 corresponding to the p-i branch. In this way, the physical junctions between the respective tunnelling junctions in the p-i-n structure 1 of an embodiment of the present invention are extended and so the tunnelling probability of carriers between the tunnelling junctions is considerably reduced to the point that any tunnelling current is blocked and/or suppressed. The leakage current and/or tunnelling current associated with the p-n junction is desirably suppressed, this being done by suitable design features, such as, for example, the choice of distance 7 between the gate electrodes 5, 6 and/or the use of heterostructures for the source semiconductor material and the drain semiconductor materials with a relatively larger band-gap material being used for the channel semiconductor material.

Figure 6:
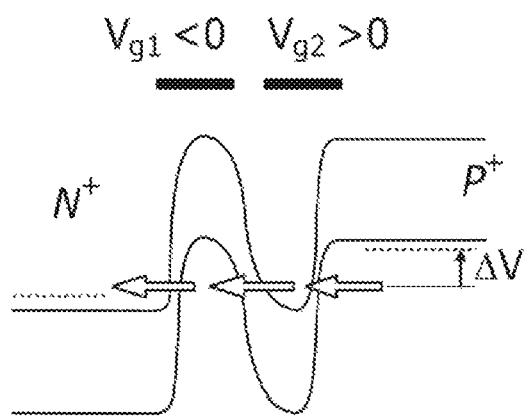

FIG. 6 schematically illustrates yet another scenario where different biases are applied to the gate electrodes in an embodiment of the present invention. In this case, and in contrast to FIG. 5 where one wide barrier is observed by carriers in the channel region 4 due to the above-described p-n junction, both the tunnelling junctions are activated. Thus, the channel region 4 includes three barriers in series and the tunnelling of carriers through all the three barriers is considerably reduced to the extent that any tunnelling current is registered as blocked and/or suppressed. An embodiment of the present invention can, of course, include further features that facilitate the reduction of any resonance between the three junctions in the channel region 4.

Thus, and as can be understood by considering FIGS. 2 to 6, by appropriately choosing the biases applied to the gate electrodes 5, 6 of an embodiment of the present invention, one of the tunnelling junctions may be opened, that is, the flow of tunnelling current through a desired tunnelling junction, either that formed at the p-i interface or the n-i interface, can be enabled. This particular scenario may be taken to correspond to when the inputs 00 or 11 yield an output of 1 in XNOR logic. Alternatively, the flow of tunnelling current through both of the tunnelling junctions may be blocked and/or suppressed by an appropriate choice of bias applied to the gate electrodes 5, 6 which scenario may be taken to correspond to when the inputs 10 or 01 yield an output of 0 in XNOR logic. For ease of understanding, the magnitude of the tunnelling probability at each junction is illustrated by the arrow in each of FIGS. 3 to 6.

Figure 7:
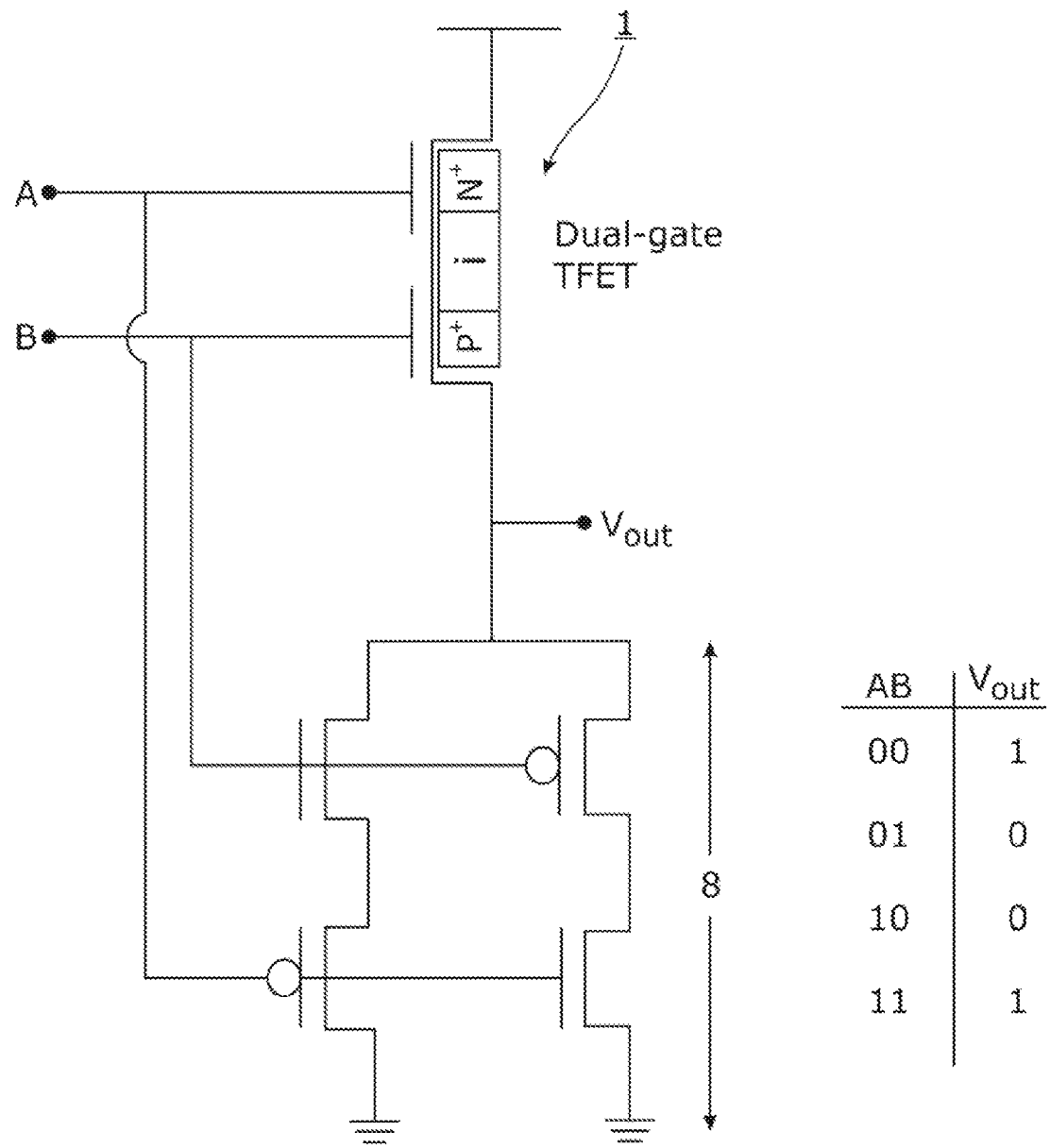
FIG. 7 depicts a further embodiment of the present invention.

Turning to FIG. 7, it can be seen that an embodiment of the present invention including the previously described TFET 1 with the dual-gate feature 5, 6, together with a pull-down circuit 8 can be used to implement an XNOR gate. In this particular example, conventional MOSFET symbols have been used to denote the pull-down chain. However, unipolar n-type and p-type FETs may alternatively be used. In order to implement an XOR gate, a pull-up chain would be used instead of the pull-down chain shown in FIG. 6. An advantage associated with an embodiment of the present invention in this case over previously-proposed devices, such as, for example, MOSFETs, is that the current does not depend on the channel length in TFETs and so the current would not be reduced by the addition of an extra gate as is the case in an embodiment of the present invention.

The present invention has been described above purely by way of example and modifications of detail can be made within the scope of the invention.

Each feature disclosed in the description, and where appropriate, the claims and the drawings can be provided independently or in any appropriate combination.

What is claimed is:

1. A tunnel field-effect transistor, comprising: at least a source region comprising a corresponding source semiconductor material; at least a drain region comprising a corresponding drain semiconductor material; and at least a channel region comprising a corresponding channel semiconductor material, which is arranged between and in contact with said source region and said drain region, said tunnel field-effect transistor further comprising:
    at least a source-channel gate electrode provided on top of and overlapping at least an interface between said source region and said channel region;
    at least an insulator corresponding to said source-channel gate electrode that is provided between said source-channel gate electrode and at least said interface between said source region and said channel region;
    at least a drain-channel gate electrode provided on top of and overlapping at least an interface between said drain region and said channel region; and
    at least an insulator corresponding to said drain-channel gate electrode that is provided between said drain-channel gate electrode and at least said interface between said drain region and said channel region.

2. The tunnel field-effect transistor according to claim 1, wherein said source-channel gate electrode is configurable to control a tunnelling current that flows between a tunnelling junction formed at said interface between said source region and said channel region and said drain-channel gate electrode is configurable to control a tunnelling current that flows between a tunnelling junction formed at said interface between said drain region and said channel region.

3. The tunnel field-effect transistor according to claim 2, wherein said tunnelling field-effect transistor is configurable to implement at least one of: an XNOR logic gate and an XOR logic gate.

4. The tunnel field-effect transistor according to claim 2, wherein a distance between said source-channel gate electrode and said drain-channel gate electrode is chosen such that said tunnel field-effect transistor is operable in one of an on mode and an off mode.

5. The tunnel field-effect transistor according to claim 4, wherein said distance between said source-channel gate electrode and said drain-channel gate electrode is chosen to be in the 10-100 nm range.

6. The tunnel field-effect transistor according to claim 2, wherein said tunnelling field-effect transistor is implemented in one of: a planar film, a vertically-standing two-dimensional layer, a nanowire geometry, and a tubular configuration.

7. The tunnel field-effect transistor according to claim 2, wherein said source semiconductor material is chosen to be different from at least said drain semiconductor material.

8. The tunnel field-effect transistor according to claim 2, wherein said source semiconductor material, said channel semiconductor material and said drain semiconductor material are chosen to be the same.

9. The tunnel field-effect transistor according to claim 2, wherein said source semiconductor material, said channel semiconductor material and said drain semiconductor material are chosen to be different from each other.

10. The tunnel field-effect transistor according to claim 2, wherein a respective doping profile of said source semiconductor material and said drain semiconductor material are chosen to facilitate manipulation of a respective electrical field established at said interface between said source region and said channel region, and said interface between said drain region and said channel region.

11. The tunnel field-effect transistor according to claim 2, further comprising a strain applicator that is configurable to apply a strain to at least one of:
    said interface between said source region and said channel region; and
    said interface between said drain region and said channel region.

12. A method for fabricating a tunnel field-effect transistor, comprising: providing at least a source region comprising a corresponding source semiconductor material; providing at least a drain region comprising a corresponding drain semiconductor material; and providing at least a channel region comprising a corresponding channel semiconductor material, which is arranged between and in contact with said source region and said drain region, said method further comprising:
    providing at least a source-channel gate electrode on top of and overlapping at least an interface between said source region and said channel region;
    providing at least an insulator corresponding to said source-channel gate electrode between said source-channel gate electrode and at least said interface between said source region and said channel region;
    providing at least a drain-channel gate electrode on top of and overlapping at least an interface between said drain region and said channel region; and
    providing at least an insulator corresponding to said drain-channel gate electrode between said drain-channel gate electrode and at least said interface between said drain region and said channel region.

13. The method according to claim 12 further comprising:
    configuring said source-channel gate electrode to control a tunnelling current that flows between a tunnelling junction formed at said interface between said source region and said channel region; and
    configuring said drain-channel gate electrode to control a tunnelling current that flows between a tunnelling junction formed at said interface between said drain region and said channel region.

14. The method according to claim 13, further comprising the step of implementing at least one of: an XNOR logic gate and an XOR logic gate.

15. The method according to claim 13, further comprising: selecting a distance between said source-channel gate electrode and said drain-channel gate electrode such that said tunnel field-effect transistor is operable in one of an on mode and an off mode.

16. The method according to claim 15, wherein said distance between said source-channel gate electrode and said drain-channel gate electrode is selected to be in the 10-100 nm range.

17. The method according to claim 13, further comprising the step of implementing said tunnel field-effect transistor in one of: a planar film, a vertically-standing two-dimensional layer, a nanowire geometry, and a tubular configuration.

18. The method according to claim 13, further comprising selecting said source semiconductor material to be different from at least said drain semiconductor material.

19. The method according to claim 13, further comprising selecting said source semiconductor material, said channel semiconductor material and said drain semiconductor material to be the same.

20. The method according to claim 13, further comprising selecting said source semiconductor material, said channel semiconductor material and said drain semiconductor material to be different from each other.

21. The method according to claim 13, further comprising selecting a respective doping profile of said source semiconductor material and said drain semiconductor material, thereby facilitating manipulation of a respective electrical field established at said interface between said source region and said channel region, and said interface between said drain region and said channel region.

22. The method according to claim 13, further comprising providing a strain applicator that is configurable to apply a strain to at least one of:
- said interface between said source region and said channel region; and
- said interface between said drain region and said channel region.

23. A method of implementing an XNOR logic gate, the method comprising:
- using a tunnel field-effect transistor according to claim 1.

* * * * *